US009520408B2

(12) United States Patent
Kim

(10) Patent No.: US 9,520,408 B2
(45) Date of Patent: Dec. 13, 2016

(54) SEMICONDUCTOR DEVICE AND METHOD OF MANUFACTURING THE SAME

(71) Applicant: SK hynix Inc., Gyeonggi-do (KR)

(72) Inventor: Tae Kyung Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/698,571

(22) Filed: Apr. 28, 2015

(65) Prior Publication Data

US 2016/0148948 A1    May 26, 2016

(30) Foreign Application Priority Data

Nov. 21, 2014   (KR) .................. 10-2014-0163747

(51) Int. Cl.

| H01L 21/20 | (2006.01) |
|---|---|
| H01L 27/115 | (2006.01) |
| H01L 23/528 | (2006.01) |
| H01L 23/535 | (2006.01) |
| H01L 21/768 | (2006.01) |

(52) U.S. Cl.
CPC ... *H01L 27/11582* (2013.01); *H01L 21/76897* (2013.01); *H01L 23/528* (2013.01); *H01L 23/535* (2013.01); *H01L 2924/0002* (2013.01)

(58) Field of Classification Search
CPC ............ H01L 27/1157; H01L 27/11556; H01L 27/11565; H01L 27/11582; H01L 29/7926

USPC .......................................................... 257/324
See application file for complete search history.

(56) References Cited

U.S. PATENT DOCUMENTS

| 9,287,286 B2* | 3/2016 | Kim .................... H01L 27/1157 |
|---|---|---|
| 2012/0228697 A1* | 9/2012 | Youm ................. H01L 29/7926 257/329 |
| 2013/0100741 A1* | 4/2013 | Choi ................. H01L 27/11565 365/185.18 |
| 2015/0104916 A1* | 4/2015 | Lee ..................... H01L 27/1157 438/268 |
| 2015/0243672 A1* | 8/2015 | Kim .................... H01L 27/1157 257/324 |
| 2015/0340370 A1* | 11/2015 | Kim .................... H01L 27/1157 365/185.18 |

FOREIGN PATENT DOCUMENTS

KR    1020140041123    4/2014

* cited by examiner

*Primary Examiner* — Michael Lebentritt
(74) *Attorney, Agent, or Firm* — IP & T Group LLP

(57) ABSTRACT

A semiconductor device and a method of manufacturing the same are provided. The semiconductor device includes a core insulating film, a channel film surrounding the core insulating film and extending to a higher level than an upper surface of the core insulating film to have a first end of the channel film exposed over the core insulating film, a channel pad formed over an inner wall of the first end of the channel film exposed over the core insulating film, and a contact plug coupled to the channel pad.

12 Claims, 8 Drawing Sheets

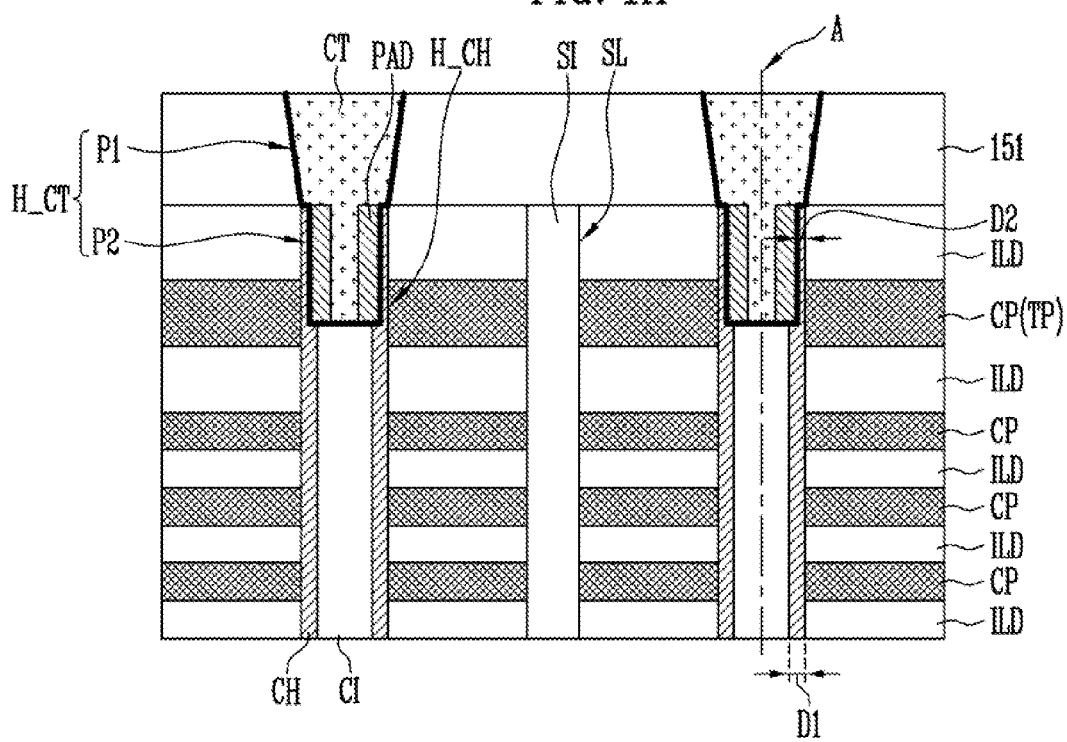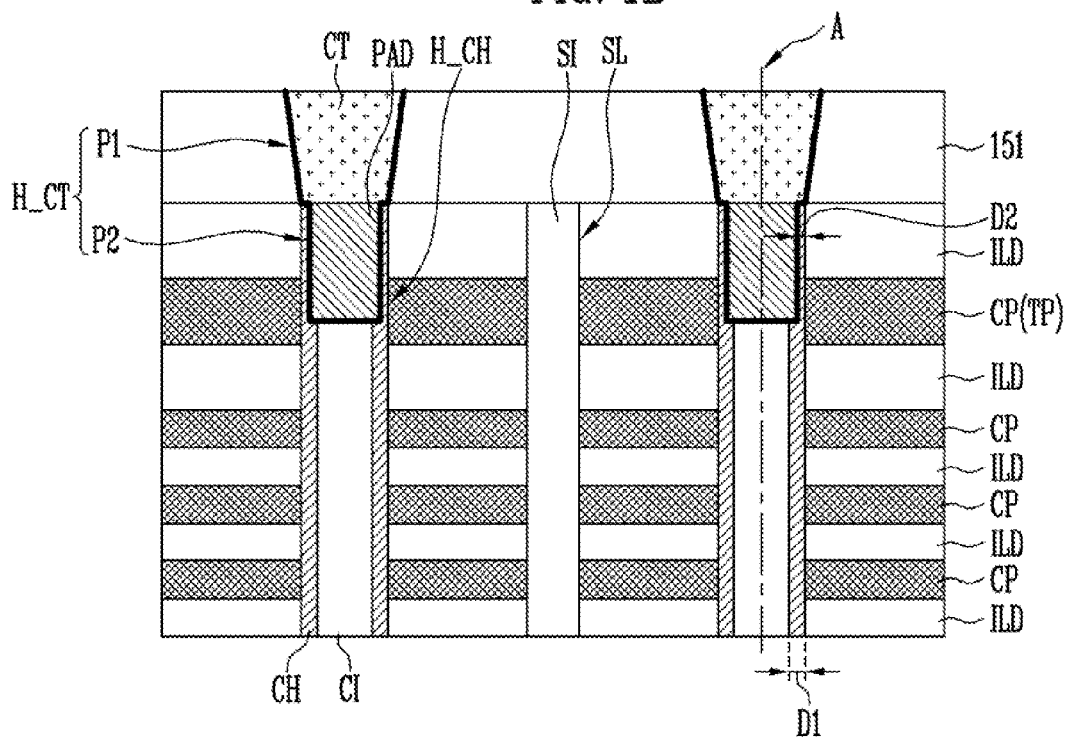

SEMICONDUCTOR DEVICE AND METHOD OF MANUFACTURING THE SAME

CROSS-REFERENCE TO RELATED APPLICATION

The present application claims priority to Korean patent application number 10-2014-0163747, filed on Nov. 21, 2014, which is herein incorporated by reference in its entirety.

BACKGROUND

Field of Invention

The present invention relates to a semiconductor device and a method of manufacturing the same. More specifically, the present invention relates to a three-dimensional semiconductor device and a method of manufacturing the same.

Description of Related Art

A semiconductor device with various structures capable of increasing a degree of Integration is being developed. As an example, a three-dimensional semiconductor device including a three-dimensional memory device has been developed.

The three-dimensional memory device may include memory cells, which are spaced apart from each other and are stacked along a channel film. The channel film may be formed as a tube type surrounding a core insulating film. To obtain such structure, a process of adjusting a height of the core insulating film to a target height may be additionally performed.

The process of adjusting the height of the core insulating film to the target height may complicate a process of manufacturing the three-dimensional semiconductor device, and degrade stability of the process. As a result, structural defects may result and operational reliability of the semiconductor device may be degraded.

SUMMARY

The present invention is directed to a semiconductor device capable of reducing structural defects by simplifying a manufacturing process thereby improving stability of the process, and a method of manufacturing the same.

One aspect of the present invention provides a semiconductor device, including: a core insulating film, a channel film surrounding the core insulating film and extending to a higher level than an upper surface of the core insulating film to have a first end of the channel film exposed over the core insulating film, a channel pad formed over an inner wall of the first end of the channel film exposed over the core insulating film, and a contact plug coupled to the channel pad.

Another aspect of the present invention provides a semiconductor device, including: a pipe gate, a drain-side stacked structure formed over the pipe gate and including first interlayer insulating films and first conductive patterns, wherein the first interlayer insulating films and the first conductive patterns are alternately stacked, a source-side stacked structure formed over the pipe gate and including second interlayer insulating films and second conductive patterns, wherein the second interlayer insulating films and the second conductive patterns are alternately stacked, a first core insulating film penetrating the drain-side stacked structure, a second core insulating film penetrating the source-side stacked structure, a third core insulating film connecting the first core insulating film and the second core insulating film and formed in the pipe gate, a channel film surrounding the first, the second, and the third core insulating films, wherein the channel film extends to a higher level than an upper surface of the first core insulating film to have a first end of the channel film exposed over the first core insulating film, wherein the channel film extends to a higher level than an upper surface of the second core insulating film to have a second end of the channel film exposed over the second core insulating film, a first channel pad formed over an inner wall of the first end of the channel film, a second channel pad formed over a sidewall of the second end of the channel film, and first and second contact plugs coupled to the first and the second channel pads, respectively.

Still another aspect of the present invention provides a method of manufacturing a semiconductor device, including: forming a stack in which first material films and second material films are alternately and repeatedly stacked, forming a channel hole penetrating the stack, forming a channel film over a sidewall of the channel hole, forming a core insulating film filling the channel hole opened by the channel film, forming an upper insulating film over the core insulating film and over the channel film, forming a first contact hole by patterning the upper insulating film, forming a second contact hole extending from the first contact hole by patterning the core insulating film to expose a first end of the channel film, forming a channel pad over an inner wall of the first end of the channel film, and forming a contact plug coupled to the channel pad by filling the first contact hole.

BRIEF DESCRIPTION OF THE DRAWINGS

FIGS. 1A and 1B are cross-sectional views illustrating a semiconductor device according to exemplary embodiments of the present invention;

DETAILED DESCRIPTION

Figure 2A:
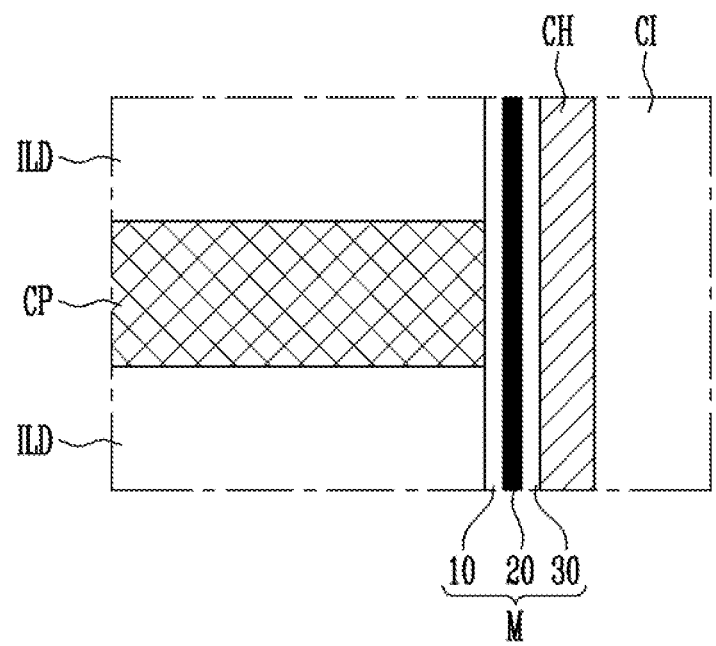
FIGS. 2A and 2B are cross-sectional views illustrating an arrangement of a multilayer memory film according to exemplary embodiments of the present invention.

Exemplary embodiments of the present invention are described more fully hereinafter with reference to the accompanying drawings. The present invention may, however, be embodied in different forms and should not be construed as limited to the embodiments set forth herein. Exemplary embodiments of the present invention described below with reference to accompanying drawings, enable those of ordinary skill in the art to embody and practice the present invention.

FIGS. 1A and 1B are cross-sectional views illustrating a semiconductor device according to exemplary embodiments of the present invention.

Referring to FIGS. 1A and 1B, a semiconductor device according to exemplary embodiments of the present invention may include a contact plug CT and a memory string connected to the contact plug CT. The memory string may be formed to have various structures. Hereinafter, a structure of the memory string will be described in detail with reference to FIGS. 4 and 5.

The memory string may be formed along the direction in which a channel film CH extends. The channel film CH may surround a core insulating film CI and may extend up to a higher level than the core insulating film CI. Accordingly, an inner wall of a first end of the channel film CH may not be blocked by the core insulating film CI but may be exposed by the core insulating film CI. The channel film CH may be formed of a semiconductor material such as polysilicon, single crystal silicon, etc. The channel film CH may be formed of an undoped silicon film.

A stack of interlayer insulating films ILD and conductive patterns CP may surround the channel film CH. The interlayer insulating films ILD and the conductive patterns CP may be alternately and repeatedly stacked. The conductive patterns CP may include a select line connected to a gate of a select transistor and word lines connected to gates of memory cells. The select transistor and the memory cells may configure a memory string. The select line and the word lines may be arranged in various manners according to a structure of the memory string. Hereinafter, arrangements of the select line and the word lines will be described in detail with reference to FIGS. 4 and 5. Each of the conductive patterns CP may include a polysilicon film, a metal film, a metal silicide film, or a combination thereof. The metal film for the conductive patterns CP may include tungsten. Each of the conductive patterns CP may further include a diffusion barrier film. Each of the interlayer insulating films ILD may be arranged between the conductive patterns CP. The interlayer insulating films ILD may include a silicon oxide film.

The stack including the interlayer insulating films ILD and the conductive patterns CP may be penetrated by a channel hole H_CH. The channel film CH may have a tube shape with a hollow center and formed along a sidewall of the channel hole H_CH. The channel hole H_CH may have the same center axis as the channel film CH as indicated by a reference numeral "A" in the drawings.

The core insulating film CI may contact the inner wall of the channel film CH, may be in a pillar shape, and may fill the channel hole H_CH. The upper surface of the core insulating film CI may be formed at a lower level than the first end of the channel hole H_CH. The upper surface of the core insulating film CI may be formed at a lower level than an upper surface of the uppermost conductive pattern TP among the conductive patterns CP.

The memory string connected to the conductive patterns CP and formed along the channel film CH may be covered by an upper insulating film 151. The upper insulating film 151 may be formed on the stack including the interlayer insulating films ILD and the conductive patterns CP. The upper insulating film 151 may include an oxide film. The upper insulating film 151 may be patterned to form a contact hole H_CT.

The contact hole H_CT may include a first portion P1 that is, a first contact hole, penetrating the upper insulating film 151, and a second portion P2 that is, a second contact hole, extending from the first portion P1 to the upper surface of the core insulating film CI. The second portion P2 may be surrounded by the channel film CH. A sidewall of the second portion P2 may form the inner wall of the channel film CH. The contact hole H_CT may be formed to expose the inner wall of the first end of the channel film CH. The first portion P1 of the contact hole H_CT may be formed to have a greater width than the second portion P2. The channel film CH may be etched in the process of forming the contact hole H_CT. Accordingly, the thickness D2 of the first end of the channel film CH, exposed by the contact hole H_CT, may be smaller than the thickness D1 of the channel film CH that surrounds the core insulating film CI. The contact hole H_CT may define an area in which a channel pad PAD and the contact plug CT are formed in a subsequent process. A center axis of the contact hole H_CT may be identical to the direction in which a center axis of the channel film CH extends, as indicated by the reference numeral A in the drawings.

The memory string may be electrically connected to the contact plug CT via the channel pad PAD. The channel pad PAD may be in contact with the inner wall of the first end of the channel film CH. The channel pad PAD may be formed on the inner wall of the first end of the channel film CH. The channel pad PAD may be formed using a selective growth method so that channel pad PAD may be formed in a self-aligned manner on the inner wall of the first end of the channel film CH. The channel pad PAD may be formed by a doped silicon film in which a p-type or n-type impurity is doped. The channel pad PAD may serve as a drain region or a source region of the select transistor. The channel pad PAD may compensate for the reduced thickness of the first end of the channel film CH. Accordingly, when the first end of the channel film CH is over-etched during the process of forming the contact hole H_CT and has a smaller thickness than the channel film CH surrounding the core insulating film CI, an embodiment of the present invention may compensate for the reduction of thickness in the first end of the channel film CH by forming the channel pad PAD, thus providing a stable channel structure.

The channel pad PAD may extend to the same level as the uppermost conductive pattern TP among the conductive patterns CP. The relative location between the channel pad PAD and the uppermost conductive pattern TP may vary according to an etching amount of the core insulating film CI during the process of forming the contact hole H_CT. The uppermost conductive pattern TP may be the select line connected to the select transistor of the memory string. The relative location between the select line and the channel pad PAD may be designed in consideration of a threshold voltage of the select transistor, disturb characteristics of the memory device, and a cell current. The relative location of the select line and the channel pad PAD may vary according to a design of a memory device of a semiconductor device.

The channel pad PAD may be in contact with the contact plug CT filling the contact hole H_CT. The contact plug CT may be formed of a conductive material such as a metal, etc. The contact plug CT may further include a diffusion barrier film. The contact plug CT may be diversely formed in the contact hole H_CT according to a formation thickness of the channel pad PAD.

The channel pad PAD may be formed in a tube shape along the inner wall of the first end of the channel film CH that is, the sidewall of the second portion P2 of the contact hole H_CT, as shown in FIG. 1A. Furthermore, the contact plug CT may have T-shape and include a lower portion and an upper portion formed to have different widths. Particularly, the lower portion of the contact plug CT may be the portion filling a center area of the channel pad PAD having the tube shape. The upper portion of the contact plug CT may have a greater width than the lower portion of the contact plug CT, may be arranged on the channel pad PAD, and fills the first portion P1 of the contact hole H_CT.

As shown in FIG. 1A, when the thickness of the channel pad PAD is controlled to open the second portion P2 of the contact hole H_CT, the contact plug CT may extend into the second portion P2 that is, the second contact hole, of the contact hole H_CT. Accordingly, a resistance of the contact plug CT may decrease. Also, as shown in FIG. 1A, when the thickness of the channel pad PAD is controlled to open the second portion P2 of the contact hole H_CT, a contact area between the channel pad PAD and the contact plug CT may increase.

In another embodiment, the channel pad PAD may be formed in a pillar shape substantially filling the second portion P2 of the contact hole H_CT completely so that the channel pad PAD may extend from the upper surface of the core insulating film CI to the upper surface of the channel film CH, as shown in FIG. 1B. Additionally, the contact plug CT may fill the first portion P1 of the contact hole H_CT and be formed on the channel pad PAD. Furthermore, no step difference may be formed on the sidewall of the contact plug CT.

The stack including the conductive patterns CP and the interlayer insulating films ILD may be penetrated by a slit SL. The slit SL may be filled with a slit insulating film SI.

Figure 2B:
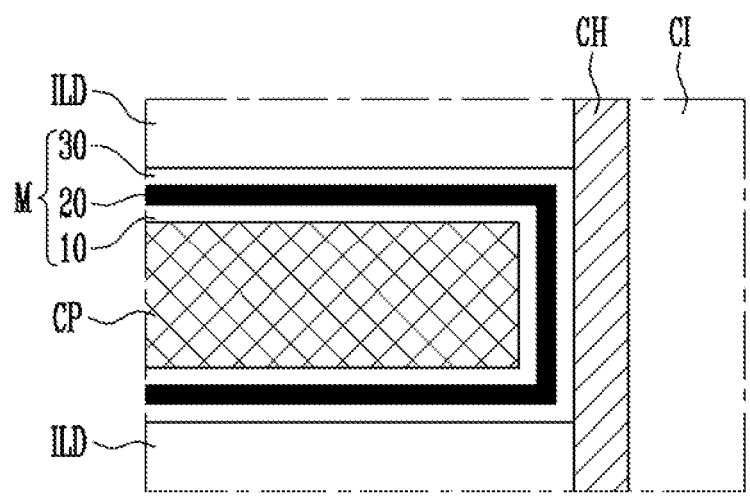

FIGS. 2A and 2B are cross-sectional views illustrating an arrangement of a multilayer memory film according to exemplary embodiments of the present invention. FIGS. 2A and 2B are enlarged diagrams of a portion of the semiconductor device shown in FIGS. 1A and 1B.

Referring to FIGS. 2A and 2B, a multilayer memory film M may be arranged between the conductive pattern CP and the channel film CH. The multilayer memory film M may include a charge blocking film 10, a data storage film 20, and a tunnel insulating film 30. The multilayer memory film M may have various structures.

For example, as shown in FIG. 2A, the multilayer memory film M may be formed to surround the channel film CH along the direction in which the channel film CH extends. In this case, the multilayer memory film M may include the charge blocking film 10, the data storage film 20, and the tunnel insulating film 30, which are sequentially stacked on the sidewall of the channel hole (H_CH of FIGS. 1A and 1B).

Alternatively, as shown in FIG. 2B, the multilayer memory film M may be formed between the conductive pattern CP and the interlayer insulating film ILD and between the conductive pattern CP and the channel film CH. In this case, the multilayer memory film M may include the charge blocking film 10, the data storage film 20, and the tunnel insulating film 30, which are sequentially stacked on a surface of the conductive pattern CP.

Besides the structures described above, the multilayer memory film M may be formed in various structures. Although not shown, for example, the multilayer memory film M may be separated by the interlayer insulating film ILD, and be arranged only between the conductive pattern CP and the channel film CH. In this case, the interlayer insulating film ILD may be in contact with the channel film CH.

As described above, the tunnel Insulating film 30 may be formed of an insulating material in which a charge tunneling is possible, for example, of a silicon oxide film. The data storage film 20 may be formed of a material film in which a charge trap is possible, for example, of a silicon nitride film. The charge blocking film 10 may be formed of an insulating material in which a charge blocking is possible, for example, a silicon oxide film, a high dielectric film having a higher dielectric constant than the silicon oxide film, or a combination thereof.

FIGS. 3A to 3F are cross-sectional views for describing a method of manufacturing a semiconductor device according to an exemplary embodiment of the present invention.

Figure 3A:
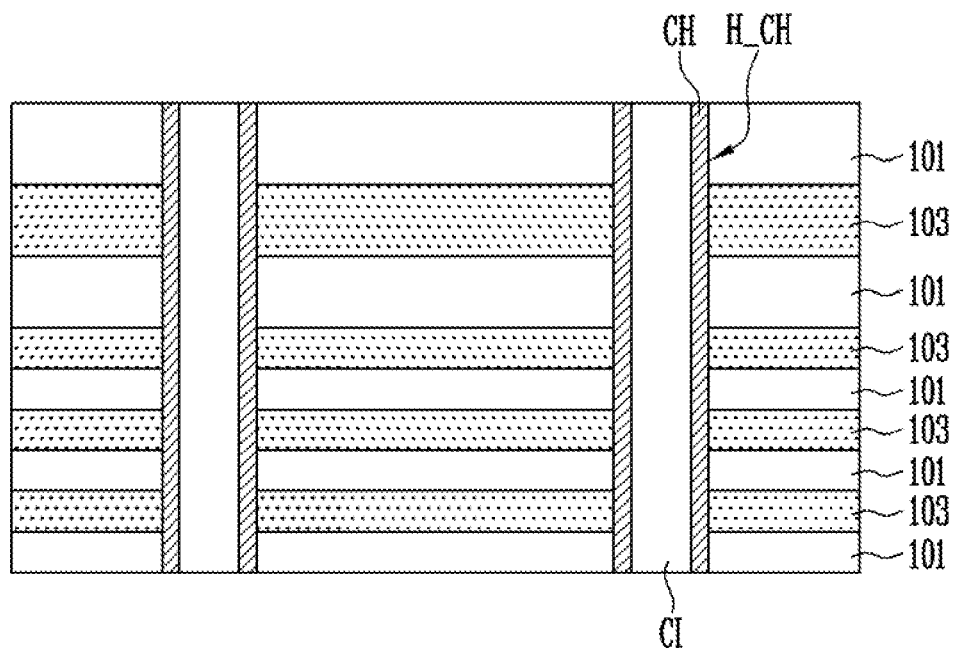
FIGS. 3A to 3F are cross-sectional views for describing a method of manufacturing a semiconductor device according to an exemplary embodiment of the present invention.

Referring to FIG. 3A, first material films 101 and second material films 103 may be alternately stacked on a lower structure (not shown).

The lower structure may vary according to the shape of a given cell structure. For example, the lower structure may be a semiconductor substrate including a source region, or a pipe gate including a pipe channel hole filled with a sacrificial material.

The stacked number of the first material films 101 and the second material films 103 may vary. The first material films 101 may include multi-layers and may include the interlayer insulating films. The second material films 103 may include multi-layers and may include the conductive patterns. The second material films 103 may be formed of a material different from that of the first material films 101. More particularly, the second material films 103 may be formed of a material having an etch selectivity with respect to the first material films 101. For example, the first material films 101 may be formed of a material suitable for the interlayer insulating film, and the second material films 103 may be formed of a material suitable for the conductive pattern.

Alternatively, the first material films 101 may be formed of a sacrificial material, and the second material films 103 may be formed of a material suitable for the conductive pattern. A doped silicon film may be used as the conductive pattern, and an undoped silicon film having an etch selectivity with respect to the doped silicon film may be used as the sacrificial material.

Alternatively, the first material films 101 may be formed of the material suitable for the interlayer insulating film, and the second material films 103 may be formed of the sacrificial material. An oxide film such as a silicon oxide film may be used as the interlayer insulating film, and a nitride film having an etch selectivity with respect to the oxide film may be used as the sacrificial material.

In FIGS. 3A to 3F, an example in which the first material films 101 are formed of the material suitable for the interlayer insulating film and the second material films 103 are formed of the sacrificial material is illustrated, but embodiments are not limited thereto.

After forming the stack by alternately stacking the first material films 101 and the second material films 103, a mask pattern (not shown) may be formed on the stack. Next, the stack including the first material films 101 and the second material films 103 may be etched by using the mask pattern as an etching barrier. Accordingly, the channel hole H_CH penetrating the stack including the first material films 101 and the second material films 103 may be formed.

Subsequently, the channel film CH may be formed over the sidewall of the channel hole H_CH. Before forming the channel film CH, the multilayer memory film M described above with reference to FIG. 2A may be formed between the stack and the channel film CH.

Afterwards, a center area of the channel hole H_CH opened by the channel film CH may be filled with the core insulating film CI. The core insulating film CI may be formed by sequentially performing processes of (i) completely filling the channel hole H_CH with a liquid material, (ii) curing the liquid material, and (iii) planarizing the cured liquid material. It is preferable that the liquid material has good gap-filling characteristics. For example, the liquid material may include polysilazane (PSZ). The PSZ may transform into a silicon oxide film by curing of the liquid material. The planarizing of the cured liquid material may include a chemical mechanical polishing (CMP) process. After planarizing the core insulating film CI, the mask pattern may be removed by a strip process and an area in which the mask pattern is removed may be filled with an insulating material (not shown).

Figure 3B:
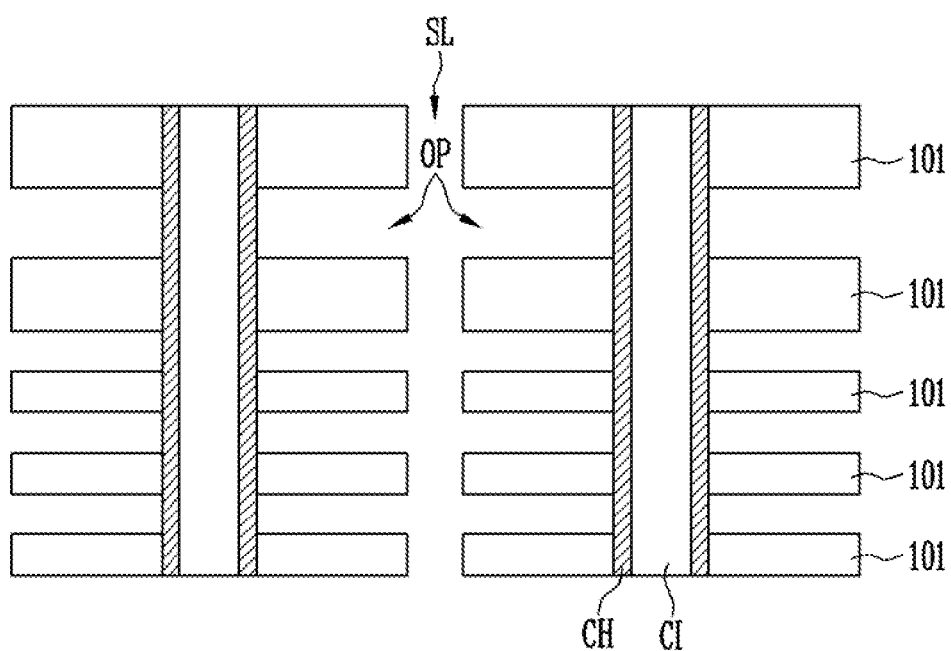

Referring to FIG. 3B, a slit SL penetrating the first material films 101 and the second material films 103 may be formed by etching the stack including the first material films 101 and the second material films 103. The slit SL may separate the stack including the first material films 101 and the second material films 103 into a plurality of stacked structures. The slit SL may be formed in various shapes, and a subsequent process performed after forming the slit SL may vary according to materials employed for the first material films 101 and the second material film 103.

For example, when the first material films 101 are formed of the interlayer insulating film and the second material films 103 are formed of an insulating material serving as the sacrificial film, the second material films 103 exposed by the slit SL may be selectively removed. Accordingly, openings OP may be formed between the first material films 101.

Although not shown, when the first material films 101 are formed of a material for the interlayer insulating film and the second material films 103 are formed of the conductive pattern, the slit SL may separate the stack into unit of memory block. In this case, the structure shown in FIGS. 1A and 1B may be formed, and a process which will be described hereinafter with reference to FIG. 3D may be continuously performed.

Although not shown, when the first material films 101 are formed of a sacrificial material and the second material films 103 are formed of the conductive pattern, the first material films 101 exposed by the slit SL may be selectively removed. Accordingly, the openings may be formed between the second material films 103. After filling the openings with an insulating material, the process which will be described hereinafter with reference to FIG. 3D may be continuously performed.

Figure 3C:
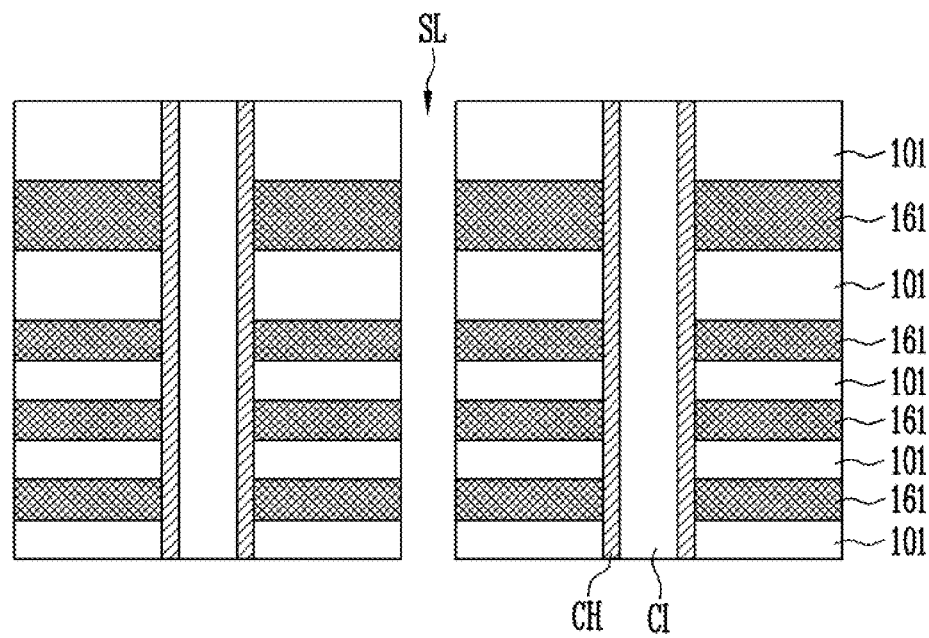

Referring to FIG. 3C, when the openings OP (shown in FIG. 3B) are formed between the first material films 101, the openings OP may be filled with a conductive material. Furthermore, except for the conductive material filling the openings OP, the remaining conductive material may be removed. Accordingly, conductive patterns 161 may be formed only inside the openings OP. Before filling the openings OP with the conductive material, the multilayer memory film M described above with reference to FIG. 2B may be formed along the surfaces of the openings OP.

Figure 3D:
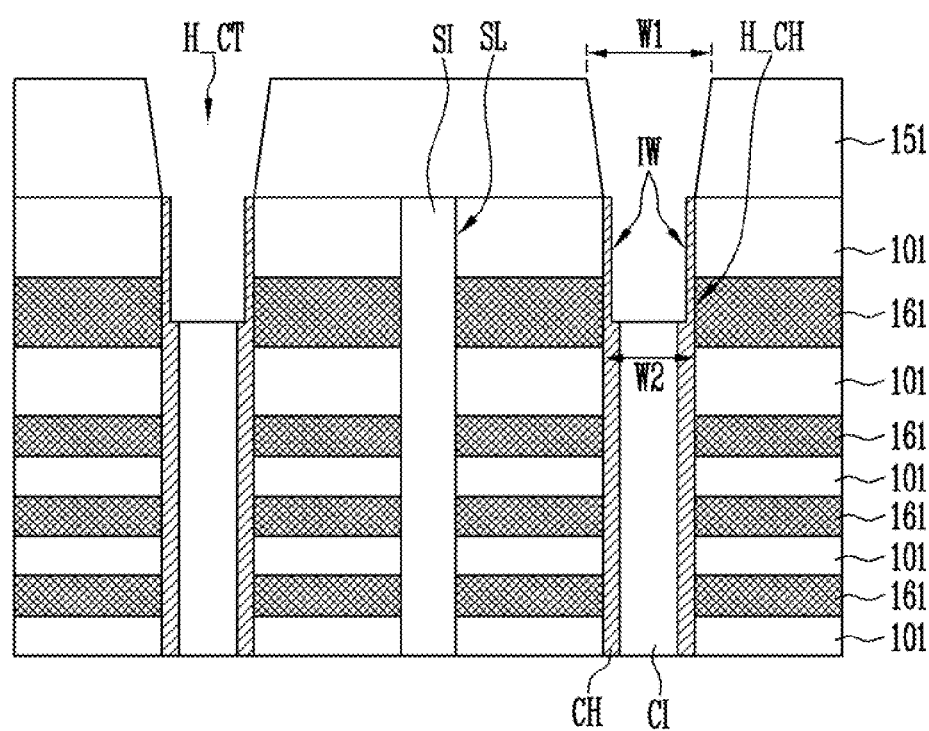

Referring to FIG. 3D, a slit insulating film SI filling the slit SL may be formed. Next, an upper insulating film 151 may be formed on the slit insulating film SI, the core insulating film CI, and the channel film CH. The upper insulating film 151 may be formed to be in contact with the upper surface of the core insulating film CI.

The upper insulating film 151 is patterned to form the first portion P1 of the contact hole H_CT or the first contact hole, to expose the core insulating film CI. The exposed core insulating film CI is recessed to a given depth to form the second portion P2 of the contact hole H_CT or the second contact hole. As a result, the upper surface of the core insulating film CI is located at a lower level than the first end or an upper end of the channel film CH. Accordingly, the inner wall of a lower portion of the channel film CH may be blocked, covered or protected by the core insulating film CI while the inner wall of the first end or the upper end of the channel film CH is exposed over the core insulating film CI.

Specifically, the contact hole H_CT extends from the upper insulating film 151 to the core insulating film CI by the given depth. Accordingly, the upper surface of the core insulating film CI is located at a lower level than the first end of the channel film CH. The width W1 of the first contact hole P1 may be greater than the width W2 of the channel hole H_CH. Accordingly, the inner wall IW of the first end or upper end of the channel film CH may be exposed by recessing the core insulating film CI.

An embodiment of the present invention can lower the location of the upper surface of the core insulating film CI using a process of forming the contact hole H_CT without adding any masking process. Accordingly, the present invention can simplify a manufacturing process of the semiconductor device. The present invention can easily adjust the height, location or level of the core insulating film CI to a target height and increase stability of the process by simplifying the process. The present invention can adjust threshold voltage of the select transistor to a target voltage and improve disturb characteristics and a cell current of the memory string by adjusting the height of the core insulating film CI. Accordingly, the present invention can improve operational reliability of the semiconductor device.

The forming of the contact hole H_CT may etch the insulating material configuring the upper insulating film 151 using an etch material having a greater etch speed than the semiconductor material configuring the channel film CH. Accordingly, the channel film CH may not be completely removed and be remained while the core insulating film CI formed of the insulating material is etched by the etch material etching the upper insulating film 151.

Figure 3E:
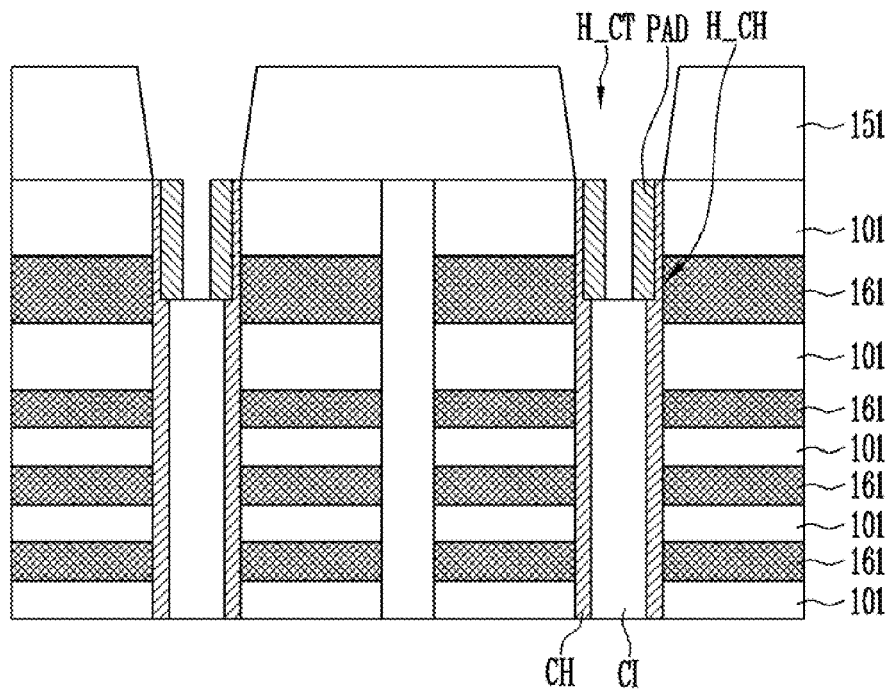

Referring to FIG. 3E, the channel pad PAD may be formed on the inner wall of the first end of the channel film CH which is exposed by the contact hole H_CT. The channel pad PAD may be grown from the inner wall of the first end of the channel film CH exposed through the contact hole H_CT toward a center axis of the channel film CH using a selective growth method. Accordingly, the channel pad PAD may be self-aligned on the inner wall of the first end of the channel film CH. A selective epitaxial growth (SEG) method may be used as the selective growth method. The channel pad PAD may be formed by growing a doped silicon film. The channel pad PAD may be formed to various thicknesses.

As shown in FIGS. 3E and 1A, the channel pad PAD may be formed in a tube shape that is hollow in the center area. Alternatively, as shown in FIG. 1B, the channel pad PAD may be formed in a pillar shape substantially filling the second portion P2 of the contact hole H_CT that is, the second contact hole completely.

Figure 3F:
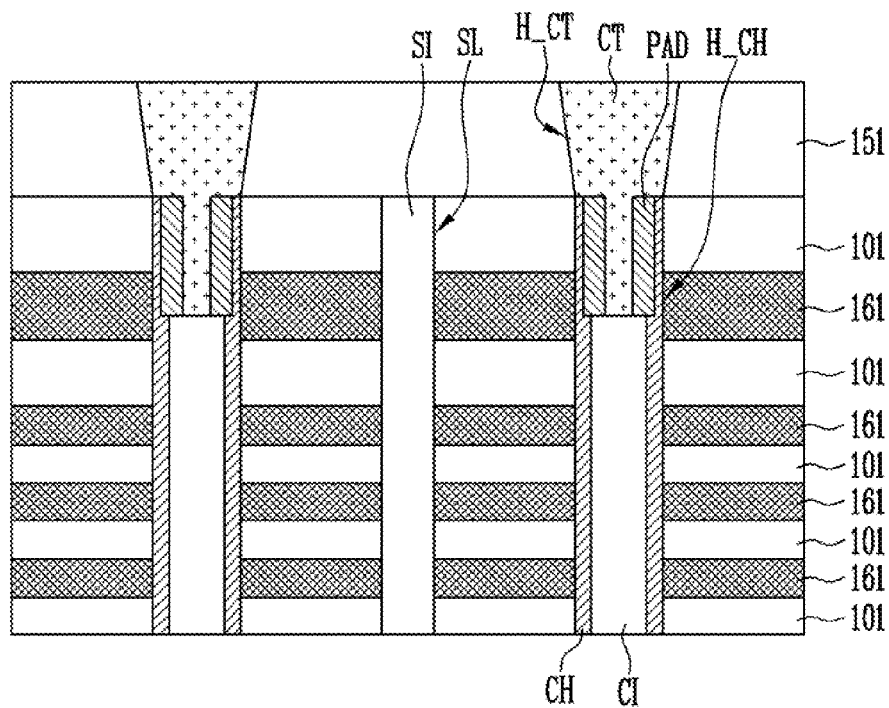

Referring to FIG. 3F, the contact hole H_CT remaining opened upon formation of the channel pad PAD may be filled with the contact plug CT. The contact plug CT may be formed in various forms according to a shape of the channel pad PAD. For example, when the channel pad PAD is formed in the tube shape that is hollow in the center, the contact plug CT may be formed by filling the hollow. In this case, the contact plug CT may be formed to have a T-shape.

Alternatively, as shown in FIG. 1B, when the channel pad PAD is formed to fill the whole second portion P2 of the contact hole H_CT or the second contact hole, the contact plug CT may extend from the first portion P1 of the contact hole H_CT that is, the first contact hole, to the second portion P2 of the contact hole H_CT that is, the second contact hole.

Figure 4:
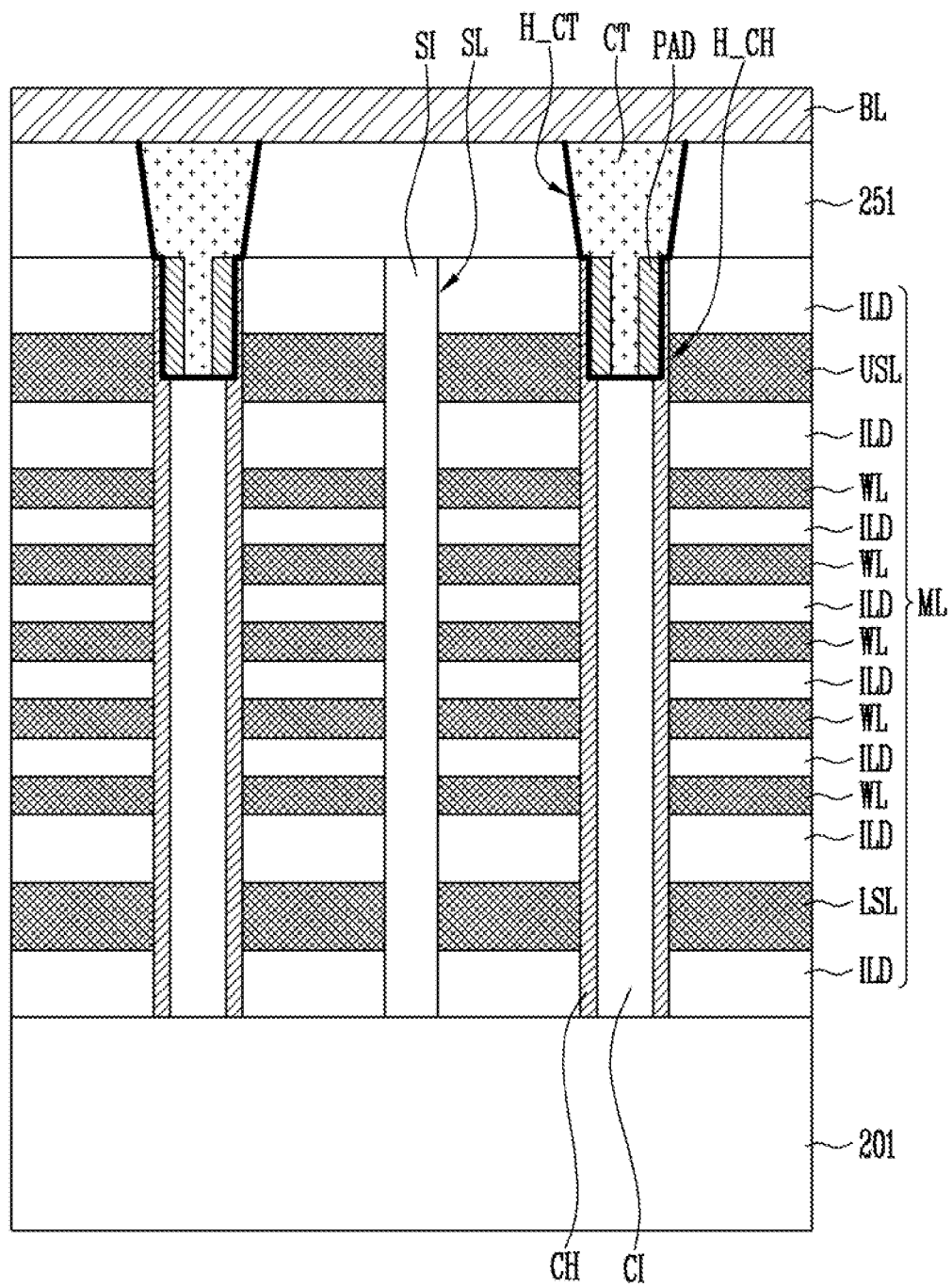
FIGS. 4 and 5 are cross-sectional views illustrating a structure of a memory string of a semiconductor device according to exemplary embodiments of the present invention.
Figure 5:
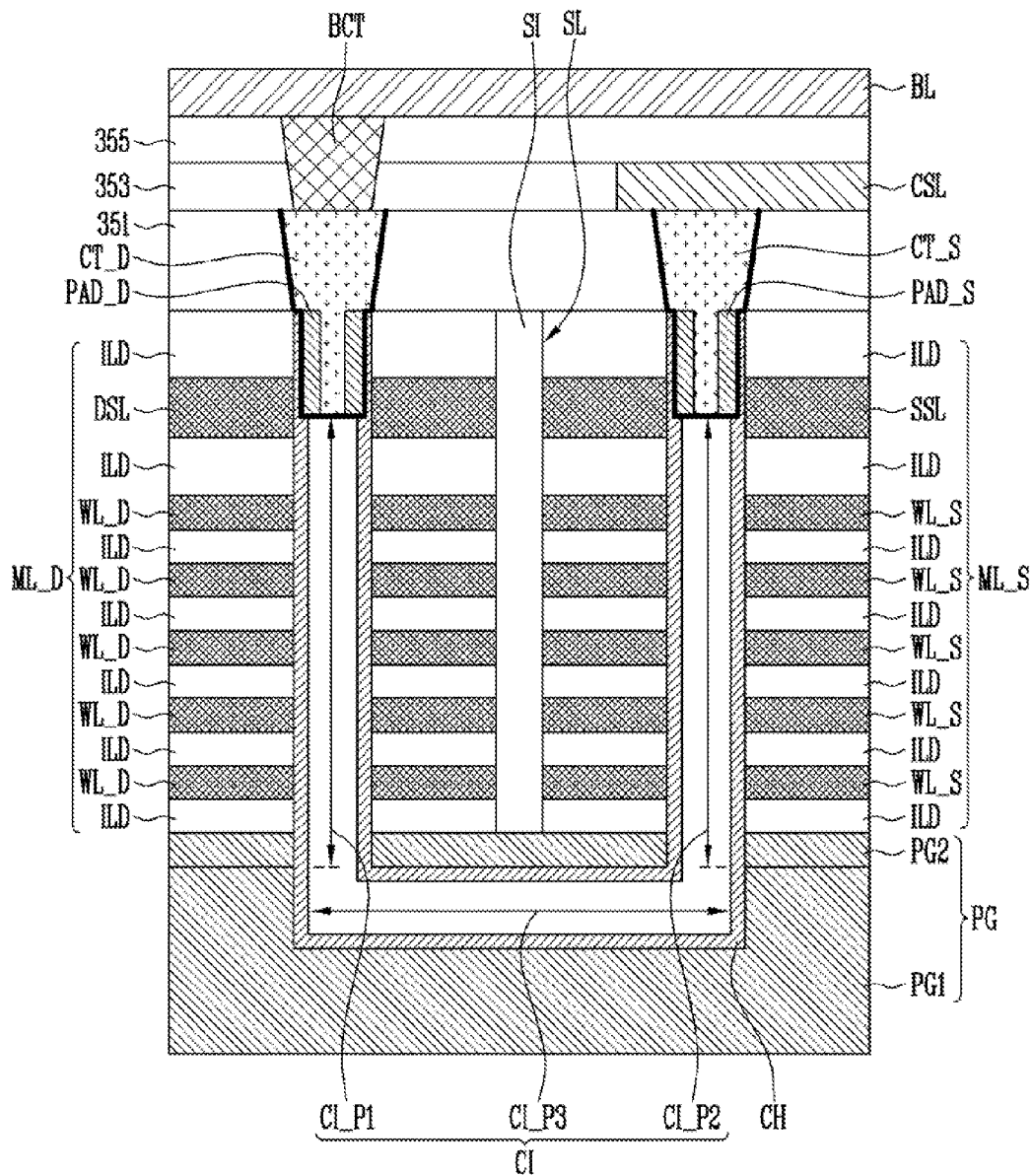

FIGS. 4 and 5 are cross-sectional views illustrating a structure of a memory string of a semiconductor device according to exemplary embodiments of the present invention.

Referring to FIG. 4, the memory string may be formed along the channel film CH having a straight type. The memory string having the straight type may be electrically connected between a semiconductor substrate 201 and a bit line BL. A stacked structure ML including the interlayer insulating films ILD and the conductive patterns LSL, WL, and USL which are alternately stacked between the semiconductor substrate 201 and the bit line BL may be formed. An upper insulating film 251 may be formed between the stacked structure ML and the bit line BL. The stacked structure ML may be defined by the slit SL and the slit insulating film SI filling the slit SL.

The semiconductor substrate 201 including the source region may be directly provided under a lower portion of the channel film CH. The source region may be formed by doping impurities in the semiconductor substrate 201 or may be formed by depositing a doped silicon film on the semiconductor substrate 201.

As described in FIGS. 1A and 1B, the channel film CH may be formed over the core insulating film CI, extend to a higher level than the core insulating film CI, and be formed of an undoped silicon film. The channel film CH and the core insulating film CI may be formed to penetrate the stacked structure ML.

The conductive patterns LSL, WL and USL configuring the stacked structure ML may include at least one first select line LSL, word lines WL arranged on the first select line LSL, and at least one second select line USL arranged on the word lines WL. The word lines WL may be formed in a plate form, and any one of the first and second select lines LSL and USL may be formed in a line form. Alternatively, the word lines WL and the first and second select lines LSL and USL may be formed in a line form.

The core insulating film CI may be formed at a lower level than an upper surface of the second select line USL and be formed at a higher level than an upper surface of the uppermost word line among the word lines WL. Accordingly, the inner wall of the first end of the channel film CH may not be blocked by the core insulating film CI but be exposed by the core insulating film CI.

The channel pad PAD may be formed on the inner wall of the first end of the channel film CH exposed by the core insulating film CI. The channel pad PAD may be formed in the form described above with reference to FIGS. 1A and 1B. The channel pad PAD may be formed of a doped silicon film and may serve as the drain region. The channel pad PAD may compensate thickness reduction of the first end of the channel film CH. The channel pad PAD may be formed at substantially the same level as the second select line USL to increase the threshold voltage of the select transistor connected to the second select line USL, thereby reducing disturb phenomenon.

The channel film CH may be electrically connected to the contact plug CT via the channel pad PAD. The contact plug CT may be formed in the structure and with the material described above with reference to FIGS. 1A and 1B.

The bit line BL may be arranged on the upper insulating film 251 and be electrically connected to the contact plug CT. The bit line BL may be electrically connected to the channel film CH of the memory string via the contact plug CT and the channel pad PAD.

Although not shown, the multilayer memory film M described above with reference to FIG. 2A may be formed to surround the channel film CH. Alternatively, the multilayer memory film M described above with reference to FIG. 2B may be formed to surround each of the conductive patterns LSL, WL, and USL.

According to the structure described above, at least one first select transistor, the memory cells, and at least one second select transistor which are connected in series may configure one memory string and may be arranged in a row.

The cell structure described above may be formed on the semiconductor substrate 201 including the source region using the process describe above with reference to FIGS. 3A to 3F.

Referring to FIG. 5, the memory string may be formed along the channel film CH which is electrically connected between the bit line BL and a common source line CSL. In the drawing, the channel film CH is formed in a U-shaped form. However, in another embodiment, the channel film CH may be formed in different forms such as a W-shaped form, etc. The bit line BL and the common source line CSL may be formed at different levels from each other and spaced apart from each other. For example, the common source line CSL may be arranged at a lower level than the bit line BL. The bit line BL and the common source line CSL may be formed of conductive material.

A pipe gate PG may be arranged at a lower level than the bit line BL and the common source line CSL. The pipe gate PG may include a first pipe gate PG1 and a second pipe gate PG2 which are vertically stacked. The first pipe gate PG1 and the second pipe gate PG2 may be formed of conductive material.

A drain-side stacked structure ML_D and a source-side stacked structure ML_S may be arranged on the pipe gate PG. The drain-side stacked structure ML_D and the source-side stacked structure ML_S may be arranged at a lower level than the bit line BL and the common source line CSL. The drain-side stacked structure ML_D and the source-side stacked structure ML_S may be electrically disconnected from each other by the slit SL and the slit insulating film SI formed inside the slit SL. The drain-side stacked structure ML_D and the source-side stacked structure ML_S may be provided under a first upper insulating film 351.

A second upper insulating film 353 may be arranged on the first upper insulating film 351. The common source line CSL may be formed inside the second upper insulating film 353. A third upper insulating film 355 may be formed between the common source line CSL and the bit line BL.

The drain-side stacked structure ML_D may include the interlayer insulating films ILD and drain-side conductive patterns WL_D and DSL which are alternately stacked. The source-side stacked structure ML_S may include the interlayer insulating films ILD and source-side conductive patterns WL_S and SSL which are alternately stacked. The drain-side conductive patterns WL_D and DSL may include at least one drain select line DSL and drain-side word lines WL_D between the drain select line DSL and the pipe gate PG. The source-side conductive patterns WL_S and SSL may include at least one source select line SSL and source-side word lines WL_S between the source select line SSL and the pipe gate PG.

The channel film CH may surround the core insulating film CI. The core insulating film CI may include a first portion CI_P1, that is, a first core insulating film, penetrating the drain-side stacked structure ML_D, a second portion CI_P2, that is, a second core insulating film, penetrating the source-side stacked structure ML_S, and a third portion CI_P3, that is, a third core insulating film, connecting the first portion CI_P1 and the second portion CI_P2 and penetrating the pipe gate PG.

The first portion CI_P1 and the second portion CI_P2 of the core insulating film CI may further penetrate the second pipe gate PG2, and the third portion CI_P3 of the core insulating film CI may be formed to penetrate the first pipe gate PG1. The first portion CI_P1 and the second portion CI_P2 of the core insulating film CI may extend to the level lower than both ends of the channel film CH. Furthermore, the upper surface of the first portion CI_P1 of the core insulating film CI may be formed at a lower level than an upper surface of the drain select line DSL and be formed at a higher level than an upper surface of the uppermost word line among the drain-side word lines WL_D. Likewise, the upper surface of the second portion CI_P2 of the core insulating film CI may be formed at a lower level than an upper surface of the source select line SSL and be formed at a higher level than an upper surface of the uppermost word line among the source-side word lines WL_S. Accordingly, the channel film CH may include both ends that is, first and second ends, respectively formed at higher levels than the upper surfaces of the first and second portions CI_P1 and CI_P2 of the core insulating film CI. As a result, inner walls of the both ends that is, first and second ends, of the channel film CH may not be blocked by the core insulating film CI but be exposed over the core insulating film CI.

The channel film CH may be formed of an undoped silicon film. The channel film CH surrounding the third portion CI_P3 of the core insulating film CI may be covered with the second pipe gate PG2.

The first end of the channel film CH may be electrically connected to the bit line BL via a drain-side channel pad PAD_D, a drain-side contact plug CT_D and a bit line contact plug BCT. The second end of the channel film CH may be electrically connected to the common source line CSL via a source-side channel pad PAD_S and a source-side contact plug CT_S.

The drain-side channel pad PAD_D may be formed on an inner wall of the first end of the channel film CH exposed by the first portion CI_P1 of the core insulating film CI. The source-side channel pad PAD_S may be formed on an inner wall of the second end of the channel film CH exposed by the second portion CI_P2 of the core insulating film CI. The drain-side channel pad PAD_D and the source-side channel pad PAD_S may have the same shape as the channel pad described above with reference to FIGS. 1A and 1B. The drain-side channel pad PAD_D and the source-side channel pad PAD_S may be formed of a doped silicon film. The drain-side channel pad PAD_D may serve as the drain region, and the source-side channel pad PAD_S may serve as the source region. The drain-side channel pad PAD_D and the source-side channel pad PAD_S may compensate for thickness reduction of the first and second ends of the channel film CH.

To reduce a disturb phenomenon by increasing threshold voltages of a source select transistor connected to the source select line SSL and a drain select transistor connected to the drain select line DSL, the drain-side channel pad PAD_D may extend to the level where the drain select line DSL is located. Likewise, the source-side channel pad PAD_S may extend to the level where the source select line SSL is located.

The source-side contact plug CT_S may be in contact with the source-side channel pad PAD_S, and the drain-side contact plug CT_D may be in contact with the drain-side channel pad PAD_D. The source-side contact plug CT_S and the drain-side contact plug CT_D may be formed of the same material as the contact plug described above with reference to FIGS. 1A and 1B. The source-side contact plug CT_S and the drain-side contact plug CT_D may have the same structure as the contact plug described above with reference to FIGS. 1A and 1B.

The common source line CSL may be formed on the first upper insulating film 351 and be electrically connected to the source-side contact plug CT_S. The bit line BL may be electrically connected to the bit line contact plug BCT penetrating the second and third upper insulating films 353 and 355.

Although not shown, the multilayer memory film M described above with reference to FIG. 2A may be formed to surround the channel film CH. Alternatively, the multilayer memory film M described above with reference to FIG. 2B may be formed to surround the source-side conductive patterns SSL and WL_S and the drain-side conductive patterns DSL and WL_D, respectively.

According to the structure described above, at least one drain select transistor, drain-side memory cells, a pipe transistor, source-side memory cells, at least one source select transistor which are arranged in series may configure one memory string and may be arranged in a U-shaped form.

The memory string described above may be formed using the process described above with reference to FIGS. 3A to 3F after forming the pipe gate PG including a pipe trench buried by the sacrificial film.

Figure 6:
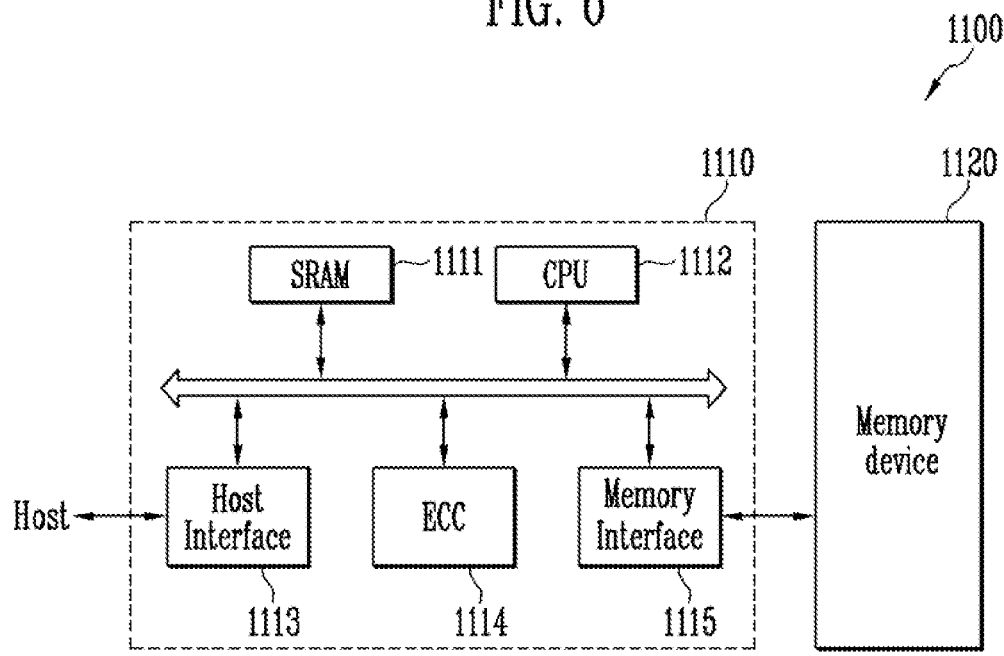
FIG. 6 is a block diagram illustrating a memory system according to an embodiment of the present invention.

FIG. 6 is a block diagram illustrating a memory system according to an embodiment of the present invention.

Referring to FIG. 6, a memory system 1100 according to an embodiment of the present invention may include a memory device 1120 and a memory controller 1110.

The memory device 1120 may have the same structure as the embodiments described above with reference to FIGS. 1A to 5. Additionally, the memory device 1120 may be a multi-chip package in which a plurality of flash memory chips are included.

The memory controller 1110 may be configured to control the memory device 1120 and may include a static random access memory (SRAM) 1111, a central processing unit (CPU) 1112, a host interface unit 1113, an error correction circuit (ECC) 1114, and a memory interface unit 1115. The SRAM 1111 may be used as an operating memory of the CPU 1112, the CPU 1112 may perform various control operations for data exchange of the memory controller 1110, and the host interface unit 1113 may include a data exchange protocol of the host connected to the memory system 1100. Furthermore, the ECC 1114 may detect and correct an error occurring in data read from the memory device 1120, and the memory interface unit 1115 may perform an interface with the memory device 1120. The memory controller 1110 may further include a read only memory (ROM), etc. for storing code data for an interface with the host.

The memory system 1100 may be a memory card or a solid state disk (SSD) configured by combining the memory device 1120 and the memory controller 1110. For example, when the memory system 1100 is the SSD, the memory controller 1110 may communicate with an external device for example, the host, through various protocols such as, a Universal Serial Bus (USB) protocol, a MultiMediaCard (MMC) protocol, a Peripheral Component Interconnect-Express (PCI-E) protocol, a Serial Advanced Technology Attachment (SATA) protocol, a Parallel ATA (PATA) protocol, a Small Computer System Interface (SCSI) protocol, an Enhanced Small Disk Interface (ESDI) protocol, an Integrated Drive Electronics (IDE) protocol, etc.

Figure 7:
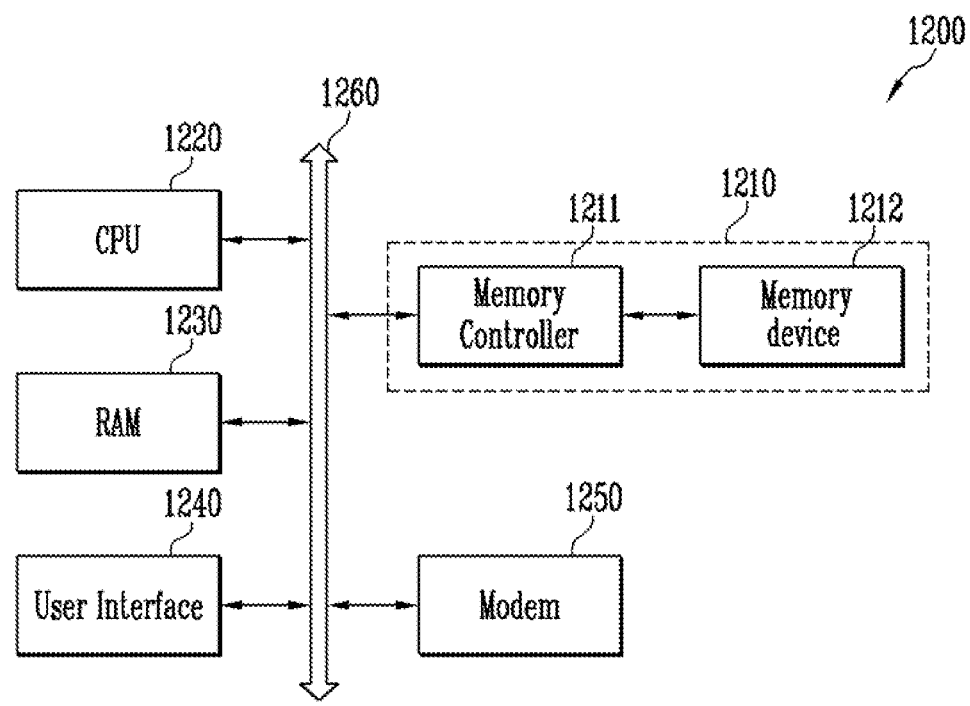
FIG. 7 is a block diagram illustrating a computing system according to an embodiment of the present invention.

FIG. 7 is a block diagram illustrating a computing system according to an embodiment of the present invention.

Referring to FIG. 7, a computing system 1200 according to an embodiment of the present invention may include a CPU 1220, a RAM 1230, a user interface unit 1240, a modem 1250, and a memory system 1210, which are electrically connected to a system bus 1260. Furthermore, when the computing system 1200 is a mobile device, a battery for supplying an operating voltage to the computing system 1200 may be further included, and an application chipset, a camera image processor (CIS), and a mobile DRAM, etc. may be further included.

The memory system 1210 may Include a memory device 1212 and a memory controller 1211, as described above with reference to FIG. 6.

An embodiment of the present invention can increase stability by simplifying a manufacturing process of the semiconductor device since the core insulating film is formed at a lower level than the channel film using the process of forming the contact hole.

An embodiment of the present invention can improve reliability of the operation of the semiconductor device by reducing structural defects of the semiconductor device since the channel pad can be self-aligned on the inner wall of the first end of the channel film exposed over the core insulating film.

What is claimed is:

1. A semiconductor device, comprising:
   a core insulating film;
   a channel film surrounding the core insulating film and extending to a higher level than an upper surface of the core insulating film to have a first end of the channel film exposed over the core insulating film;
   a channel pad formed over an inner wall of the first end of the channel film exposed over the core Insulating film; and
   a contact plug coupled to the channel pad.

2. The semiconductor device of claim 1, further comprising:
   a stack including interlayer insulating films and conductive patterns and surrounding the channel film, wherein the interlayer insulating films and the conductive patterns are alternately stacked over each other;
   an upper insulating film formed over the stack;
   a first contact hole penetrating through the upper insulating film and overlapping the channel pad; and
   a second contact hole extending from the first contact hole to the core insulating film and surrounded by the first end of the channel film,
   wherein the contact plug fills the first contact hole.

3. The semiconductor device of claim 2, wherein the channel pad is formed in a tube shape, and
   wherein the contact plug is T-shaped and further fills the second contact hole.

4. The semiconductor device of claim 2, wherein the channel pad extends to fill the second contact hole, and
   wherein the contact plug is formed over the channel pad.

5. The semiconductor device of claim 2, wherein the conductive patterns comprise:
   a select line formed at substantially the same level as the channel pad; and
   word lines formed at a lower level than the channel pad.

6. The semiconductor device of claim 1, wherein the channel pad comprises a doped silicon film.

7. The semiconductor device of claim 1, wherein the channel film comprises an undoped silicon film.

8. The semiconductor device of claim 1, wherein the first end of the channel film has a narrower width than the remaining portion of the channel film which is not exposed over the core insulating film.

9. The semiconductor device of claim 2, further comprising:
   a substrate provided under the stack and having a source region connected to a second end of the channel film; and
   a bit line connected to the contact plug.

10. A semiconductor device, comprising:
    a pipe gate;
    a drain-side stacked structure formed over the pipe gate and including first interlayer insulating films and first conductive patterns, wherein the first interlayer insulating films and the first conductive patterns are alternately stacked;
    a source-side stacked structure formed over the pipe gate and including second interlayer insulating films and second conductive patterns, wherein the second interlayer insulating films and the second conductive patterns are alternately stacked;
    a first core insulating film penetrating the drain-side stacked structure;
    a second core insulating film penetrating the source-side stacked structure;
    a third core insulating film connecting the first core insulating film and the second core insulating film and formed in the pipe gate;
    a channel film surrounding the first, the second, and the third core insulating films, wherein the channel film extends to a higher level than an upper surface of the first core insulating film to have a first end of the channel film exposed over the first core insulating film, wherein the channel film extends to a higher level than an upper surface of the second core insulating film to have a second end of the channel film exposed over the second core insulating film;
    a first channel pad formed over an inner wall of the first end of the channel film;
    a second channel pad formed over an inner wall of the second end of the channel film; and
    first and second contact plugs coupled to the first and the second channel pads, respectively.

11. The semiconductor device of claim 10, wherein the first and second channel pads are in a tube shape with a hollow center and formed over the inner walls of the first and second ends of the channel film, respectively,
    wherein the first contact plug is in a T-shape so that an upper portion has a wider width than a lower portion,
    wherein the lower portion of the first contact plug fills the hollow center of the first channel pad,
    wherein the second contact plug is in a T-shape so that an upper portion has a wider width than a lower portion, and
    wherein the lower portion of the second contact plug fills the hollow center of the second channel pad.

12. The semiconductor device of claim 10, wherein the first channel pad is in a pillar shape with no hollow center and fills the region defined by the first end of the channel film and the first core insulating film,
    wherein the second channel pad is in a pillar shape with no hollow center and fills the region defined by the second end of the channel film and the second core insulating film,
    wherein the first contact plug is formed at a higher level than the first channel pad, and wherein the second contact plug is formed at a higher level than the second channel pad.

\* \* \* \* \*